United States Patent
Grunzke

(10) Patent No.: US 10,140,225 B2
(45) Date of Patent: *Nov. 27, 2018

(54) IMPEDANCE ADJUSTMENT IN A MEMORY DEVICE

(71) Applicant: MICRON TECHNOLOGY, INC., Boise, ID (US)

(72) Inventor: Terry Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/721,990

(22) Filed: Oct. 2, 2017

(65) Prior Publication Data

US 2018/0032453 A1 Feb. 1, 2018

Related U.S. Application Data

(63) Continuation of application No. 14/013,239, filed on Aug. 29, 2013, now Pat. No. 9,779,039.

(51) Int. Cl.
*H03K 19/003* (2006.01)
*G06F 13/16* (2006.01)
*G11C 7/10* (2006.01)

(52) U.S. Cl.
CPC ........ *G06F 13/1694* (2013.01); *G11C 7/1057* (2013.01); *G11C 2207/2254* (2013.01)

(58) Field of Classification Search
CPC .............. G06F 13/1694; G11C 7/1057; G11C 2207/2254

USPC .......................................................... 326/30
See application file for complete search history.

(56) References Cited

U.S. PATENT DOCUMENTS

| 7,535,250 | B2 | 5/2009 | Batt |
| 7,557,603 | B2 | 7/2009 | Pan |
| 7,626,416 | B2 | 12/2009 | Kim |
| 7,916,574 | B1 | 3/2011 | Solomon et al. |
| 2005/0002223 | A1 | 1/2005 | Coteus et al. |
| 2006/0015691 | A1* | 1/2006 | Louie ............... G11C 16/20 711/154 |
| 2007/0279084 | A1 | 12/2007 | Oh et al. |
| 2009/0063789 | A1 | 3/2009 | Greeff et al. |
| 2009/0254925 | A1 | 10/2009 | Ayyapureddi et al. |

(Continued)

*Primary Examiner* — Don Le

(74) *Attorney, Agent, or Firm* — Dicke, Billig & Czaja, PLLC

(57) ABSTRACT

Methods include configuring termination devices of a driver circuit of a memory device, storing a first plurality of trim values representative of the configuration of the termination devices of the driver circuit, transferring a second plurality of trim values to a different memory device, and configuring a plurality of termination devices of a driver circuit of the different memory device in response to the second plurality of trim values. Methods further include determining configuration information corresponding to a configuration of a particular driver circuit of a memory device adjusted to a desired impedance, storing a first set of trim values representative of the configuration information, and adjusting an impedance of a different driver circuit of the memory device in response to the first set of trim values and a correction factor representative of expected differences in characteristics between the particular driver circuit and the different driver circuit.

20 Claims, 9 Drawing Sheets

(56) References Cited

U.S. PATENT DOCUMENTS

| | | |
|---|---|---|
| 2010/0283503 A1 | 11/2010 | Hollis |
| 2011/0128038 A1* | 6/2011 | Ko .......................... G11C 7/02 |
| | | 326/30 |
| 2011/0176345 A1 | 7/2011 | Chen |
| 2011/0242916 A1 | 10/2011 | Seol et al. |
| 2012/0042148 A1 | 2/2012 | Grunzke |
| 2013/0031315 A1 | 1/2013 | Abdulla et al. |
| 2016/0338190 A1 | 11/2016 | Chang et al. |

* cited by examiner

IMPEDANCE ADJUSTMENT IN A MEMORY DEVICE

RELATED APPLICATION

This Application is a Continuation of U.S. application Ser. No. 14/013,239, titled "IMPEDANCE ADJUSTMENT IN A MEMORY DEVICE," filed Aug. 29, 2013, now U.S. Pat. No. 9,779,039 issued Oct. 3, 2017, which is commonly assigned and incorporated herein by reference.

TECHNICAL FIELD

The present disclosure relates generally to impedances in electronic devices and, in particular, in one or more embodiments, the present disclosure relates to adjusting impedances of terminals of memory devices.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM) and Flash memory. Non-volatile memory is memory that can retain its stored data for some extended period without the application of power. Flash memory devices have developed into a popular source of non-volatile memory for a wide range of electronic applications. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Flash memory typically utilizes one of two basic architectures known as NOR Flash and NAND Flash. The designation is derived from the logic used to read the devices. Typically, an array of memory cells for NAND flash memory devices is arranged such that memory cells of a string are connected together in series, source to drain.

Electronic systems, such as memory systems, often include one or more types of memory and that memory is typically coupled to one or more communications channels within the memory system. Time varying signals in such systems are utilized to transfer information (e.g., data) over one or more conductors often referred to as signal lines. These signal lines are often bundled together to form a communications bus, such as an address or data bus, for example.

To meet the demands for higher performance operating characteristics, designers continue to strive for increasing operating speeds to transfer data across these communications buses within these system. However, one issue with increased data transfer rates is maintaining signal integrity during these bursts of data on the various bus signal lines of the memory system. As these transfer rates increase, the impedance characteristics of a data bus become more pronounced. Capacitive and inductive characteristics of the signal lines may begin to distort the signal waveforms on the data bus at these higher data rates. Waveforms may begin to spread out and/or reflections may occur at locations of unmatched impedance on the data bus signal lines, for example. Signal integrity (e.g., data integrity) can be affected when an impedance (e.g., output impedance) of one or more nodes of a memory device coupled to a communication bus is not properly matched to the impedance of the communications bus. Impedance mismatch might result from process variations, temperature variations and voltage (e.g., power supply potential) variations in a memory device, for example. Thus, it is typically desirable to reduce these effects in order to reduce the likelihood of data corruption as data is transmitted on a bus, for example.

For the reasons stated above, and for other reasons which will become apparent to those skilled in the art upon reading and understanding the present specification, there is a need in the art for methods of impedance adjustment operations in memory devices, such as in memory devices comprising an electronic system.

DETAILED DESCRIPTION

Figure 1:
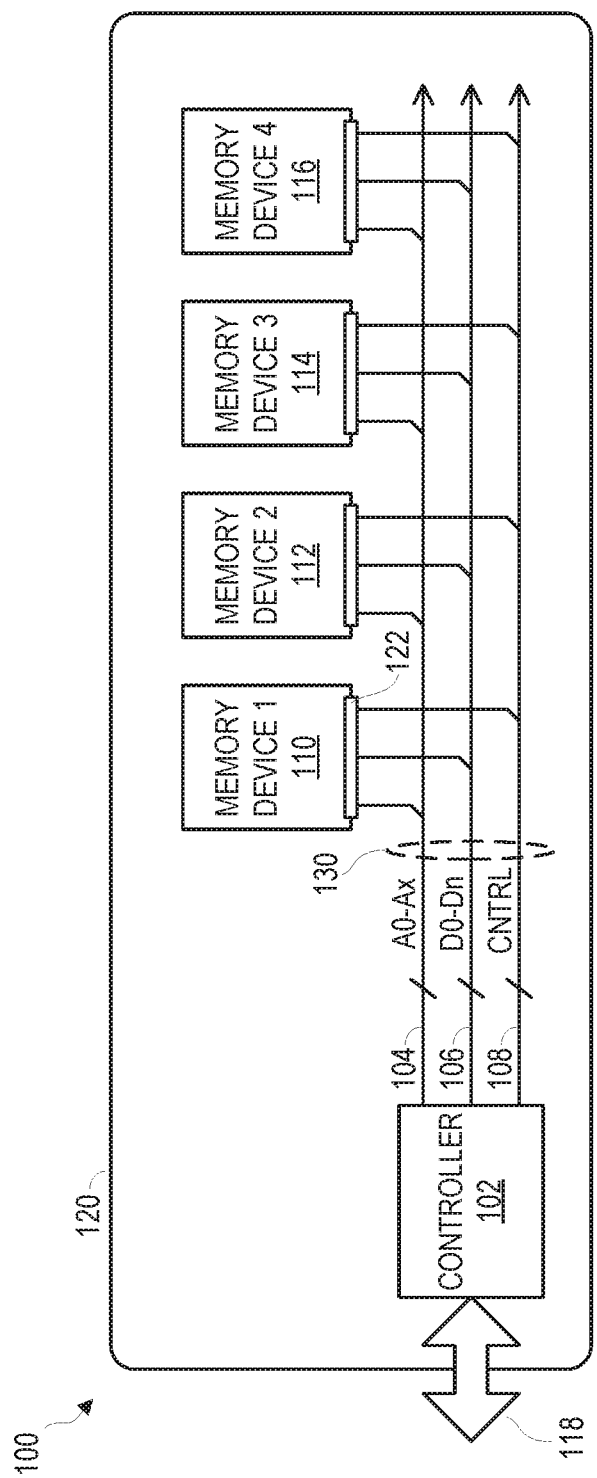
FIG. 1 shows a functional block diagram of a typical memory system having a plurality of memory devices.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense.

FIG. 1 illustrates a simplified diagram 100 of a number of memory devices 110-116 coupled to a communications bus 130 (e.g., system bus) as part of an electronic system (e.g., memory system) 120. Each memory device 110-116 might include one or more memory die (not shown.) Memory devices 110-116 comprising multiple die are sometimes referred to as a Multi-Chip Package (MCP), for example. A controller 102, such as a processor or other type of controlling circuitry might be coupled to the communications bus 130. Controller 102 regulates various operations within the electronic system 120 as well as providing interactivity with another device or system coupled to the interface 118, for example.

The communications bus 130 might include one or more of an address bus A0-Ax 104, data bus D0-Dn 106 and a control signal bus CNTRL 108. Each of the address bus, data bus and control signal bus might include one or more signal lines. Individual control signals of 108 are not shown to improve readability of the figure. Control signals 108 might include control signals such as Address Latch Enable (ALE), Command Latch Enable (CLE), data strobe (DQS) and a clock signal (CLK), for example. Some communications busses utilize the same signal lines to transfer different types of information. For example, the address bus and data bus might transfer their respective signals on the same signal lines of the communications bus. The memory devices 110-116, communications bus 130 and controller 102 may collectively define an electronic system 120 and might be configured (e.g., physically arranged and mounted) on a printed circuit board (PCB), for example.

A memory device 110 might be coupled to the communications bus 130 by an interface 122. Each memory interface 122 might include one or more nodes for coupling signal lines within (e.g., internal to) the memory device to respective signal lines of the communications bus. The nodes comprising an interface 122 might include input nodes and/or output nodes (e.g., I/O nodes), for example. Additional nodes of each memory interface 122 might include nodes to be coupled to one or more power supplies (not shown in FIG. 1), such as power and reference potentials, for example. A memory interface 122 might include an electromechanical type connection or might include soldered lead connections to the communications bus 130 of the memory system 120.

One method used to improve signal integrity, such as in high data rate applications, is to use what is referred to as On-Die Termination (ODT). ODT may be utilized by configuring each of the nodes of an interface 122 (e.g., data outputs) of a particular memory device 110 (e.g., die or package) coupled to the communications bus 130 to act (e.g., function) as a terminator (e.g., termination die) for one or more of the nodes of interface 122 coupled to the communications bus. For example, for a particular die to act as a termination die (e.g., a terminating memory device), driver circuitry including pull-up and pull-down resistors configured as a voltage divider might be coupled to each output node of a memory device acting as a termination die. Thus, the output nodes of the termination die might be configured to act as terminators for the bus to which they are coupled.

Figure 2:
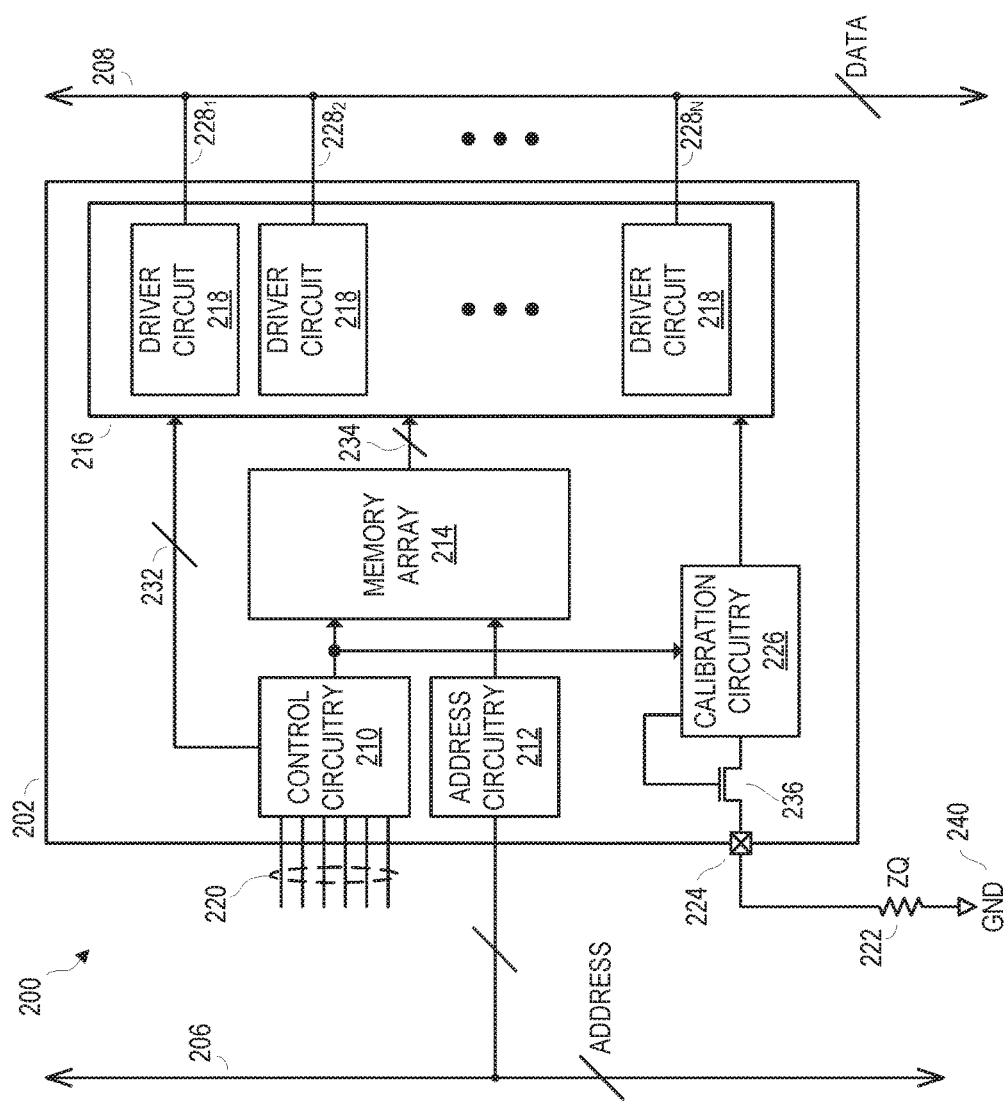
FIG. 2 shows a functional block diagram of a typical memory device of a memory system as shown in FIG. 1.

FIG. 2 illustrates a memory device 202, such as one of memory devices 110-116 shown in FIG. 1, coupled to an address bus 206, data bus 208 and control signal bus 220. The address bus 206, data bus 208 and control signal bus 220 might be combined, at least in part, to define a communications bus such as described above with respect to FIG. 1, for example. Control signal bus 220 shown coupled to memory device 202 might include both memory device specific control signals and control signals commonly coupled to multiple memory devices. Memory device 202 might be configured to utilize ODT as discussed above.

Memory device 202 further illustrates additional elements of a typical memory device, such as configured for ODT operations. Memory device 202 includes address circuitry 212 which is coupled the address bus 206 in order to receive addressing information from an external controller in order to access the memory array 214 of the device. Memory device 202 further includes control circuitry 210 which is coupled to control signal bus 220 and is configured to manage operations within the memory device 202, such as verify, read, write and erase operations to be performed on the memory array 214, for example. Control circuitry 210 is also configured to manage operations within the driver (e.g., output driver) circuitry 216 by communicating various control signals over one or more signal lines 232. These operations might include placing the individual driver circuits (e.g., output driver circuits) 218, and thus the output nodes $228_1$-$228_N$, in a driving mode or termination mode, for example. The driver circuits 218 of the driver circuitry 216 might be placed in a driving mode when the memory device 202 is selected to drive the data bus 208 to a particular state, such as in response to performing a read operation in the memory device 202, for example. The memory array 214 might communicate data to the driver circuits 218 by one or more signal lines 234, for example.

Memory device 202 might also be placed in a termination mode. In termination mode, the individual driver circuits 218 couple (e.g., switch in) a number of pull-up and/or pull-down resistances (not shown in FIG. 2) coupled to one or more (e.g., all) output nodes $228_1$-$228_N$ of the memory device 202. These resistances are switched in and out responsive to one or more control signals provided by control circuitry 210 across control signal lines 232. A calibration operation, sometimes referred to as ZQ calibration, might be performed on a memory device 202 so as to adjust the driver circuits pull-up and/or pull-down resistance values to adjust the impedance (e.g., output impedance) of the output nodes 228, for example. Calibration operations might be facilitated by reference to a reference resistance 222 (e.g., sometimes referred to as a ZQ resistor) coupled to a node (e.g., terminal) 224 of the memory device 202. A typical resistance value for the ZQ resistor might be 240 ohms, for example. ZQ resistor 222 might be further coupled to receive a reference potential, such as Vss or a ground potential 240.

Calibration circuitry 226 of the memory device 202 might be configured to facilitate performing output driver calibration operations, and selectively activating termination devices, in the memory device 202 in accordance with various embodiments. Control circuitry 210 might be configured to provide one or more control signals to the calibration circuitry 226, such as to initiate calibrations operations and/or to indicate which termination devices should be activated. Alternatively, the calibration circuitry 226 may be a function of the control circuitry 210. The calibration circuitry 226 may be coupled to a particular driver circuit 218 which might be representative of the remaining driver circuits of the driver circuitry 216. Calibration circuitry 226 might further be configured to decouple circuitry (e.g., a driver circuit 218 and/or output node 228) from the memory device interface node 224, such as by deactivating a transistor 236. Control circuitry 210 and/or calibration circuitry 226 can independently or together (or in combination with other circuitry, firmware, and/or software) be considered a controller (e.g., internal controller).

Figure 3:
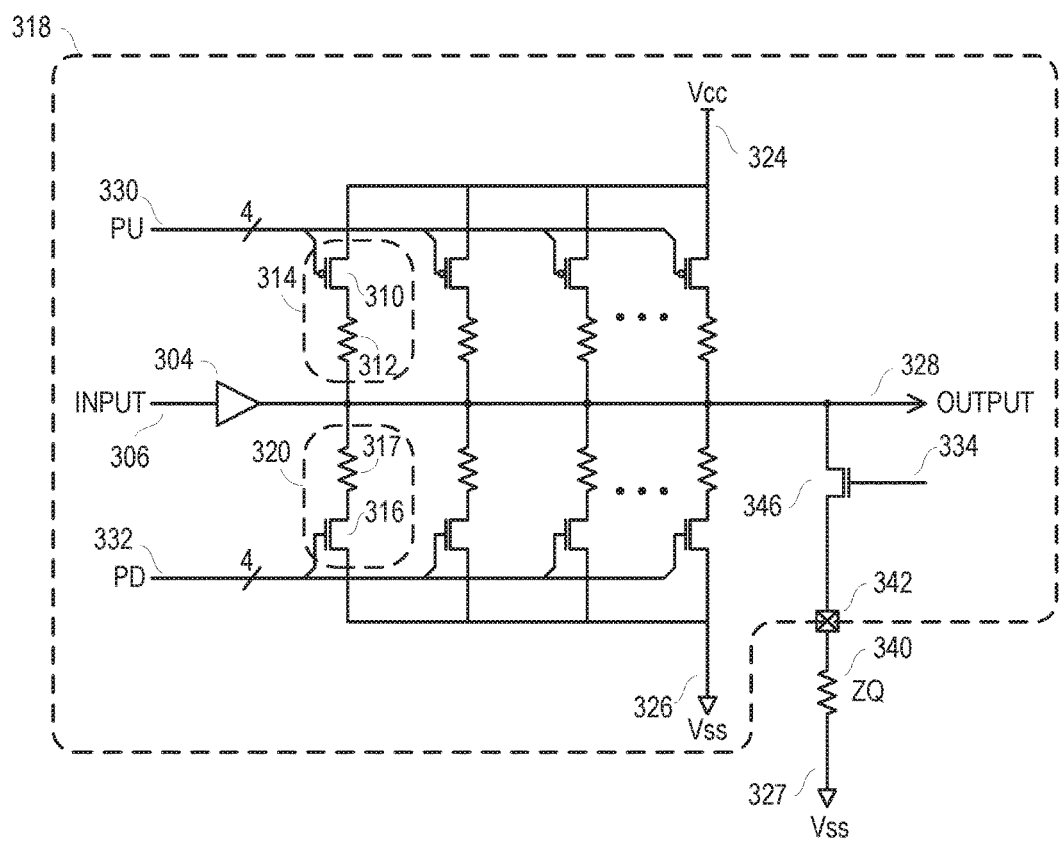
FIG. 3 illustrates a schematic representation of a driver circuit of a memory device.

FIG. 3 shows a more detailed illustration of a driver circuit 318, such as a driver circuit 218 shown in FIG. 2. Driver circuit (e.g., output driver circuit) 318 includes a driver 304 which is configured to drive the output node (e.g., output signal line) 328 responsive to a logic level of data received at an input 306 from the memory array, such as in response to a read operation, over a particular signal line of the signal lines 234 coupling the memory array to the driver circuitry. The output node 328 might be one of the plurality of output nodes 228 coupled to the data bus 208 shown in FIG. 2, for example.

Driver circuit 318 also includes a plurality of termination devices (e.g., pull-up termination devices 314), such as a switch (e.g., a transistor) 310 and a resistance (e.g., a resistor) 312 shown coupled between the output node 328 and a supply node 324. The supply node 324 might be coupled to receive a positive voltage, such as a supply potential Vcc. However, the supply node 324 might be coupled to receive other voltage sources. The control gates of each transistor 310 of the pull-up termination devices 314 may be coupled by signal lines 330 to receive control signals generated by the control circuitry 210 and/or the calibration circuitry 226, for example. Signal lines 330 of the example of FIG. 3 might include four discrete signal lines, one signal line coupled to a control gate of each of the four transistors 310, e.g., in a one-to-one relationship. Signal lines 330 are shown as a single bus to improve readability of the figure.

Driver circuit 318 also includes another plurality of termination devices (e.g., pull-down termination devices 320), such as a switch (e.g., a transistor) 316 and a resistance (e.g., a resistor) 317 shown coupled between the output node 328 and a reference node 326. The reference node might be coupled to receive a reference potential, such as a ground potential Vss. In general, however, the supply node 324 is coupled to receive a voltage level that is higher than the voltage level the reference node 326 is coupled to receive. Similar to the transistors 310 of the pull-up termination devices 314, the control gates of each transistor 316 of the pull-down termination devices 320 may be coupled by signal lines 332 to receive control signals generated by the control circuitry 210 and/or the calibration circuitry 226, for example. Signal lines 332 of the example of FIG. 3 might include four discrete signal lines, one signal line coupled to a control gate of each of the four transistors 316, e.g., in a one-to-one relationship. Signal lines 332 are also shown as a single bus to improve readability of the figure. Groups of termination devices, such as the plurality of pull-up termination devices 314 and plurality of pull-down termination devices 320, are sometimes referred to as unit drivers. Pull-up unit drivers might include different numbers of termination devices than pull-down unit drivers.

The driver circuit 318 configuration shown in FIG. 3 allows for the control circuitry 210 and/or calibration circuitry 226 to selectively activate various combinations of the pull-up termination devices 314 and/or pull-down termination devices 320 of a driver circuit 318, such as while the memory device is acting as a termination device or while the memory device is performing a calibration operation. Each pull-up termination device 314 and/or each pull-down termination device 320 might be configured to exhibit a different termination resistance when activated. This can facilitate additional flexibility in configuring the termination circuitry to adjust the impedance (e.g., output impedance) of the particular output node 328 when the memory device is operating as a termination device. One or more of resistors 312 and/or resistors 317 might have the same resistance. Driver circuit 318 might have different numbers of pull-up termination devices 314 and/or pull-down termination devices 320 and might, for example, include many more termination devices 314, 320 than those shown in FIG. 3.

The control circuitry 210 and/or calibration circuitry 226 might also selectively adjust the termination devices (e.g., activate one or more pull-up termination devices 314 and/or pull-down termination devices 320) in the output driver circuit 318 in response to configuration information, e.g., a stored termination value associated with a particular driver circuit. The stored termination values (e.g., values corresponding to an activation configuration of pull-up termination devices 314 and/or pull-down termination devices 320) are sometimes referred to as trim values or trim settings.

FIG. 3 further illustrates a reference resistance (e.g., ZQ resistor) 340, such as reference resistance (e.g., ZQ resistor) 222 shown in FIG. 2, coupled between a reference node 327 and the output node 328. The reference node 327 might be coupled to receive the same reference potential as reference node 326. The ZQ resistor 340 may be coupled to the output node 328 by way of a switch (e.g., transistor) 346. A control signal line 334 configured to selectively activate and deactivate the transistor 346 might be responsive to (e.g., coupled to) the calibration circuitry 226 of FIG. 2, for example. Thus, during a calibration operation the calibration circuitry 226 may drive a signal on control signal line 334 to activate transistor 346 to couple the ZQ resistor 340, by way of the memory device interface node 342, to the output node 328 of the driver circuit 318. The calibration circuitry 226 might drive another signal on control signal line 334 to deactivate the transistor 346 to decouple the ZQ resistor from the output node 328, such as when operations other than calibration operations of the driver circuit 318 are being performed.

A calibration operation performed on driver circuit 318 might be described by way of example and reference to FIGS. 2 and 3. The driver circuit 318 might be calibrated to determine which of the pull-up termination devices and/or which of the pull-down termination devices might be selected (e.g., activated) to achieve a desired impedance (e.g., output impedance) of the driver circuit 318, such as on output node 328, for example. A driver circuit 318 might be calibrated in a number of steps. For example, the pull-up portion of the driver circuit 318 might be adjusted during a first portion of the calibration operation. The pull-down portion of the driver circuit might then be subsequently calibrated during a second portion of a calibration operation.

During a first portion of a calibration operation, the pull-down termination devices 320 might be deactivated so as to decouple any of the pull-down termination devices 320 from the output node 328, i.e., to remove the effect of any resistance 317 from the output node 328. Transistor 346 might be activated so as to couple the ZQ resistor 340 to the output node 328. Calibration circuitry 226 might then begin activating one or more pull-up termination devices to couple the output node 328 to the supply node 324 to set up a voltage divider with respect to the output node 328. Thus, the output voltage of the output node 328 is a function of the activated pull-up termination devices 314 and the resistance of the ZQ resistor 340. The output voltage of the output node 328 is sensed while activating the one or more pull-up termination devices 314. For example, it might be desirable to attempt to match the pull-up resistance with the pull-down resistance (e.g., resistance of the ZQ resistor) in the driver circuit 318. Thus, the calibration circuitry 226 might activate one or more pull-up termination devices 314, by way of driving control signals of signal lines 330, until a voltage (e.g., desired [e.g., target] voltage corresponding to a desired [e.g., target] impedance) sensed on the output node 328 reaches (e.g., equals or exceeds, or equals or falls below) Vcc/2, for example. When the output voltage is sensed to reach Vcc/2 in this example, the pull-up resistance of the activated pull-up termination devices 314 would be substantially the same as the pull-down resistance of the ZQ resistor 340. The calibration circuitry 226 then might store the configuration of the activated pull-up termination devices 314 resulting in the Vcc/2 voltage sensed on the output node 328. Activation of the pull-up termination devices 314 might proceed in an order to produce increasing or decreasing resistance values, such as from a first resistance value (e.g., a lowest or a highest resistance value obtainable from activation of any combination of the pull-up termination devices 314) to a second resistance value (e.g., a highest or a lowest resistance value, respectively, obtainable from activation of any combination of the pull-up termination devices 314). Where the termination devices each have similar (e.g., equal) resistance values, the order may include increasing or decreasing numbers of activated termination devices, producing decreasing or increasing resistance values, respectively. Other orders of activation might also be used during the calibration operation. Where the activation order proceeds in increasing resistance values, sensing of the output node 328 might seek to determine when the sensed output voltage equals or falls below the desired (e.g., target) voltage, i.e., at what combination of activated pull-up termination devices 314 does the voltage of the output node 328 fall below the desired voltage. Conversely, where the activation order proceeds in decreasing resistance values, sensing of the output node 328 might seek to determine when the sensed output voltage equals or exceeds the desired (e.g., target) voltage, i.e., at what combination of activated pull-up termination devices 314 does the voltage of the output node 328 exceed the desired voltage.

A second portion of the calibration operation might be performed subsequent to performing the first portion of the calibration operation such as discussed above. The second portion of the calibration operation might be performed to calibrate the pull-down resistance of the driver circuit. The transistor 346 might be deactivated by the calibration circuitry 226 by driving the control signal of control signal line 334 so as to decouple the ZQ resistor 340 from the output node 328. With the ZQ resistor 340 decoupled from the output node 328, the calibration circuitry 226 activates the pull-up termination devices 314 in the configuration determined during the first portion of the calibration operation discussed above. The calibration circuitry 226 also activates one or more pull-down termination devices 320, by way of driving control signals 332, until a voltage sensed on the output node 328 reaches (e.g., equals or exceeds, or equals or falls below) the desired (e.g., target) voltage of the first portion of the calibration operation, e.g., Vcc/2 in this example. Activation of the pull-down termination devices 320 might proceed in an order, such as discussed with respect to activation of the pull-up termination devices 314, of decreasing or increasing resistance values of the activated pull-down termination devices 320. Sensing of the voltage of the output node 328 might also be performed similar to that described above, e.g., until the voltage of the output node 328 equals or falls below the desired (e.g., target) voltage where the activation order proceeds in decreasing resistance values of the pull-down termination devices 320 or until the voltage of the output node 328 equals or exceeds the desired voltage where the activation order proceeds in increasing resistance values of the pull-down termination devices 320. As the output node 328 has an output voltage of Vcc/2, i.e., the desired (e.g., target) voltage in this example, the calibration circuitry 226 determines that the pull-up resistance of the driver circuit 318 matches the pull-down resistance of the driver circuit 318 as the pull-up resistance and the pull-down resistance form a voltage divider with respect to output node 328. The calibration circuitry 226 then might store the configuration of the activated pull-down termination devices 320 during the second portion of the calibration operation. Thus, the driver circuit 318 has been calibrated by determining a configuration for activating the pull-up and pull-down termination devices in the driver circuit 318 to achieve a desired impedance (e.g., target impedance) of the output node 328. The configuration of the activated and/or deactivated pull-up termination devices 314 and pull-down termination devices 320 corresponding to the desired impedance (e.g., target impedance) might be represented by a set of trim values, for example.

The calibration operation discussed above takes a particular amount of time to be performed. As multiple memory devices might be coupled to the same bus, typically each memory device is sequentially calibrated as the coupled bus needs to be otherwise inactive when performing each calibration operation in each memory device. Thus, the amount of time needed to perform a calibration operation in each memory device is generally cumulative as only one memory device may be calibrated at a time. This may result in undesirable delays as memory device operations may be postponed until the memory device calibration operations have been completed. Thus, an undesirable increase in data latency (e.g., read latency) during operation of the memory devices might result.

Various embodiments of the present disclosure facilitate performing calibration operations on a subset (e.g., less than all) of a plurality of memory devices coupled to a data bus, such as part of an electronic system. Thus, these methods might provide a reduction in latency in memory devices and systems due to calibration operation delays, for example.

Figure 4:
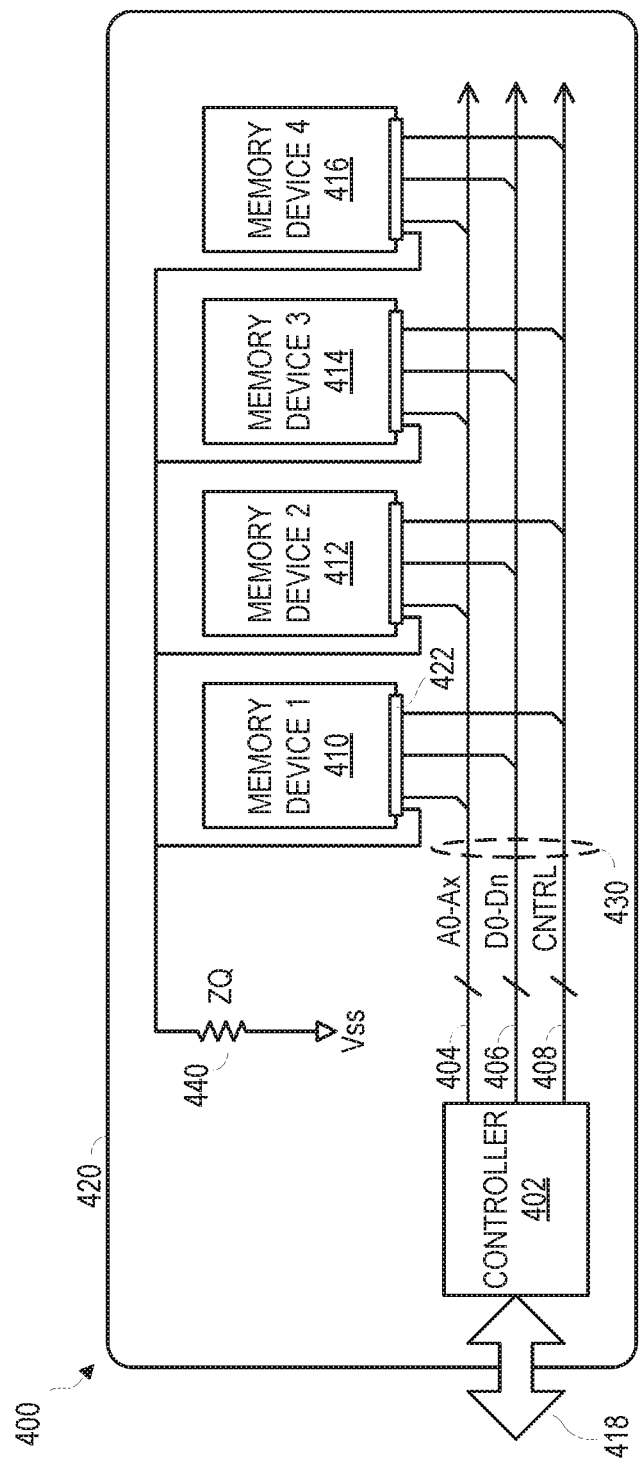
FIG. 4 shows a functional block diagram of a memory system having a plurality of memory devices according to an embodiment of the present disclosure.
Figure 5:
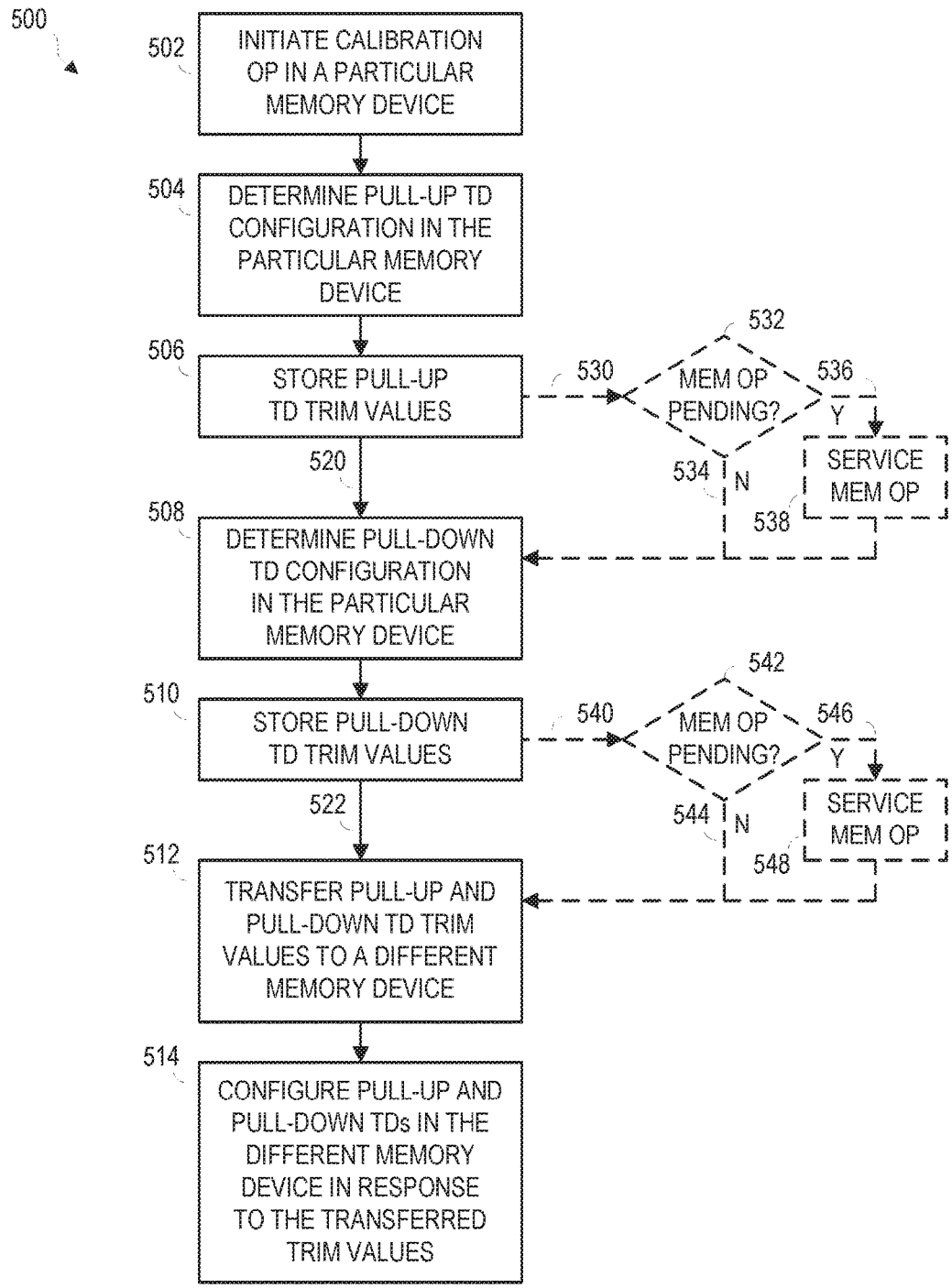
FIG. 5 illustrates a flowchart of a calibration operation according to an embodiment of the present disclosure.

A calibration operation might be described by way of example and reference to FIGS. 3, 4 and 5. FIG. 4 illustrates a plurality of memory devices 410-416 coupled to a communications bus 430. Each of memory devices 410-416 might include a memory device such as described above with respect to FIGS. 2 and 3, for example. The communications bus may include an address bus 404, data bus 406 and a control signal bus 408. FIG. 4 further illustrates that each memory device 410-416 is commonly coupled to reference resistance (e.g., ZQ resistor) 440. Each memory device might have a particular node (e.g., device interface node 342 of FIG. 3) of its interface 422 coupled to the ZQ resistor 440, for example. The ZQ resistor 440 is coupled to receive a reference potential, such as Vss or ground potential, for example. FIG. 4 further illustrates a controller 402 coupled to the communications bus 430. The controller 402 might be configured to be coupled 418 to other controllers (not shown), such as a host or master controller, for example.

FIG. 5 illustrates a flowchart 500 of a calibration method of driver circuits of two or more memory devices, for example. A particular memory device might be selected as a memory device including at least one driver circuit to be calibrated as part of the calibration operation to be performed. A calibration operation might be initiated 502 responsive to a reset operation, such as following the application of power to the memory device or system. Calibration operations might be initiated periodically, such as at some frequency while the memory device is operating. Calibration operations might be initiated 502 in response due to a change in temperature sensed in a memory device. For example, a temperature change that exceeds a particular temperature change threshold value might indicate a calibration operation should be initiated 502. Further, changes in power supply potentials (e.g., drift in voltage supply potentials) might also indicate a calibration operation should be initiated.

Subsequent to initiating 502 a calibration operation in a particular memory device, a first portion of the calibration operation is performed to determine 504 the configuration of pull-up termination devices, such as pull-up termination devices 314, of a selected driver circuit of the memory device. The first portion of the calibration operation is performed to determine 504 a configuration of activated pull-up termination devices for the selected driver circuit to achieve a desired (e.g., target) impedance of an output node. During the first portion of the calibration operation, the ZQ resistor 440 might be coupled to output node of an interface 422 and the pull down termination devices of the selected driver circuit might be deactivated. Configuration information (e.g., termination values, trim values or trim settings) might be determined (e.g., generated) corresponding to the determined configuration, such as which pull-up termination devices are activated to achieve the desired output impedance in the driver circuit while coupled to the ZQ resistor 440, for example. The trim values might include a binary number wherein each bit position corresponds, respectively, to an activation status of the transistors 310 of the individual pull-up termination devices 314, for example.

The selected output driver can be configured to activate a particular configuration of pull-up termination devices by reference to the trim values determined during the first portion of the calibration operation. The determined trim values might be stored 506 in the particular memory device, such as in a non-volatile memory location (e.g., memory array 214) in the memory device, for example.

Subsequent to completing the first portion of the calibration operation, the ZQ resistor 440 might be decoupled from the output node. A second portion of the calibration operation is performed to determine 508 the configuration of pull-down termination devices, such as pull-down termination devices 320, of the particular memory device to achieve the desired impedance on the output node. Additional trim values are determined corresponding to the determined configuration of the pull-down termination devices facilitating the desired impedance during the second portion of the calibration operation. Similar to the trim values discussed above with respect to the first portion of the calibration operation, the trim values determined during the second portion of the calibration operation might include a binary number wherein each bit position corresponds, respectively, to an activation status of the transistors 316 of the individual pull-down termination devices 320, for example.

The determined trim values corresponding to the pull-down termination devices might be stored 510 in the particular memory device along with the trim values corresponding to the pull-up termination devices discussed above, for example. Thus, the selected driver circuit of the particular memory device may be configured to activate a particular configuration of pull-up termination devices and pull-down termination devices to achieve a desired impedance (e.g., output impedance) by reference to the trim values determined during the first portion and the second portion of the calibration operation. The calibration circuitry of the memory device might be configured to activate the pull-up and pull-down termination devices responsive to the trim values stored in the memory device during operation of the memory device.

Continuing with the present example, the particular memory device undergoing the first portion and the second portion of the calibration operation discussed above might include memory device 410 shown in FIG. 4, for example. Subsequent to determining the trim values (e.g., pull-up termination device trim values and pull-down termination device trim values) corresponding to a desired impedance of the selected driver circuit, the determined trim values might be transferred 512, such as over the communications bus 430, to one or more different memory devices 412-416 shown in FIG. 4. The trim values received at the one or more other memory devices 412-416 are then used to configure 514 one or more driver circuits (e.g., activation of pull-up and pull-down termination devices) of the one or more different memory devices 412-416 to obtain an expected similar output impedance as the calibrated selected driver circuit of the particular memory device, e.g., under the presumption that the different memory devices 412-416 include driver circuits of the same configuration as the driver circuits of the particular memory device 410. It is noted that in various embodiments, a calibration operation of a memory device includes determining trim values for termination device configurations for only one driver circuit of the memory device. In such embodiments, remaining driver circuits of the memory device could either use the same trim values as the selected driver circuit for which trim values were determined, or corrections could be applied to remaining driver circuits as described later herein. Similarly, the trim values determined for a selected driver circuit of the particular memory device might be used to configure multiple driver circuits of a different memory device, or they might be used to configure only a corresponding driver circuit of the different memory device, e.g., a driver circuit driving an output node that is commonly coupled with an output node of the selected driver circuit of the particular memory device.

A calibration operation typically takes longer to perform than only activating particular driver circuit pull-up termination devices and pull-down termination devices responsive to determined trim values. Thus, the calibration delay to adjust the output impedance of a plurality of memory device driver circuits might be reduced if a calibration operation is not sequentially performed on each memory device. Thus, a corresponding reduction in latency (e.g., read data latency) might be realized. For example, a memory system might include 16 memory devices (e.g., die) and each calibration operation performed on each die might take 1 µS, for example. Thus, sequentially calibrating each die might take substantially equal to 16 µS to complete. This is in contrast with a calibration operation of a single die which as stated above might take 1 µS. However, transferring trim values to one or more different memory devices and configuring each driver circuit with the received trim values might take 500 nS in total. Thus, the calibration operation and adjustment of the output impedances of a number of memory devices might take 1.5 µS to complete. Thus, a reduction in the calibration time of 14.5 µS (e.g., 16 µS-1.5 µS) might be achieved over sequentially calibrating each memory device.

A calibration operation according to one or more embodiments might be described by way of further reference to FIG. 5. During a calibration operation, such as discussed above with respect to FIG. 5, the particular memory device of memory devices 410-416 might receive a command to perform a memory operation, such as a verify, read, write and/or erase operation in the memory device, for example. The calibration and/or control circuitry might determine if a memory device operation command has been received corresponding to the memory device undergoing the calibration operation or a memory device (e.g., a memory device different than the memory device being calibrated) to be adjusted as a result of performing the calibration operation in the selected memory device. Path 530 of FIG. 5 illustrates an alternative to path 520. The calibration circuitry and/or control circuitry might make a determination 532 after completing step 506 if a memory device operation command has been received and is pending. If a memory device operation is not pending 534 for the particular memory device or another memory device coupled to the particular memory device, for example, then step 508 might be performed as discussed above. If a memory device operation has been determined to be pending 536, the control circuitry of the memory device might service the pending memory device operation 538, such as performing a read operation in a memory device while pausing the calibration operation. Step 508 might then be performed following completion of the serviced memory device operation 538.

According to another embodiment, path 540 of FIG. 5 illustrates an alternative path to path 522. For example, following completion of step 510, the calibration circuitry and/or control circuitry of the memory device might make a determination 542 if a memory device operation command has been received and if a memory device operation is pending. If a memory device operation is not pending 544, such as for the particular memory device or another memory device coupled to the particular memory device, for example, then step 512 might be performed as discussed above. If a memory device operation has been determined to be pending 546, the control circuitry of the memory device might service the pending memory device operation 548, such as performing a pending read operation in the memory device while pausing the calibration operation, for example. Following completion of the serviced memory device operation 548, step 512 might then be performed as discussed above. Thus, a calibration operation according to various embodiments might be interrupted when the memory device undergoing the calibration operation and/or a memory device sharing a communications bus with the memory device undergoing the calibration operation is selected for a memory device operation, such as a read operation, for example.

Thus, according to one or more embodiments, a calibration operation such as discussed with respect to FIG. 5 might be interrupted at one or more points during the calibration operation to service one or more memory device operations and then resume performing the calibration operation. By interrupting the calibration operation and servicing the one or more memory device operations, a reduction in a delay (e.g., latency) might be realized over waiting to perform the memory device operation until after the calibration operation has been completed.

Figure 6:
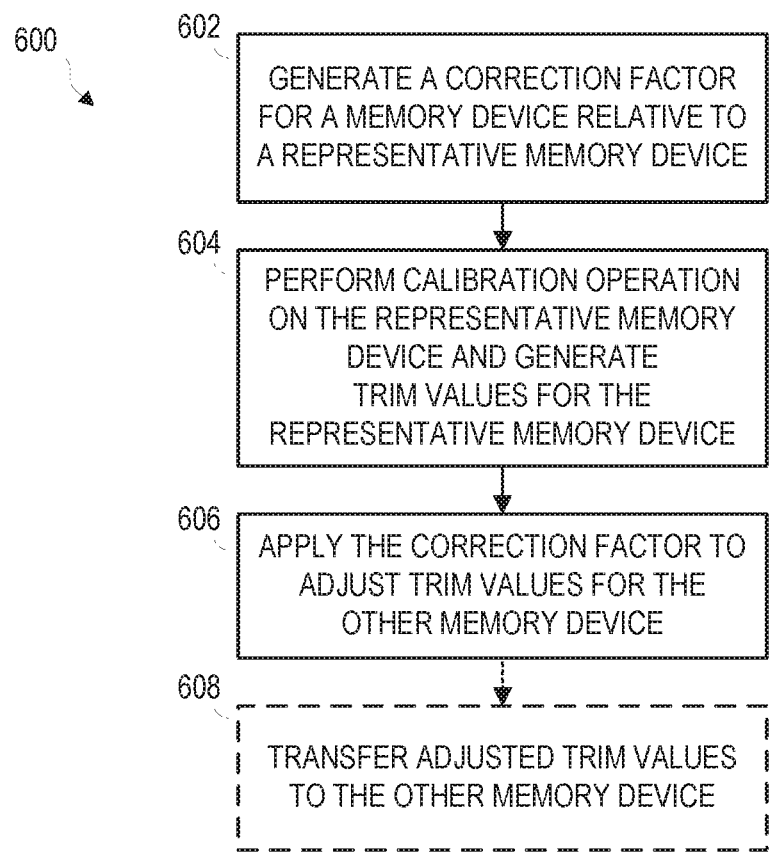
FIG. 6 illustrates a flowchart of a calibration operation according to an embodiment of the present disclosure.

FIG. 6 illustrates a flowchart corresponding to various embodiments of the present disclosure. Due to various reasons, different driver circuits of memory devices might exhibit different characteristics when configured with the same trim values. For example, differences in process and operating characteristics (e.g., structural differences, ambient conditions and/or power supply sensitivities) might be observed between different driver circuits of the same or different memory devices. Calibration correction factors corresponding to one or more memory devices, such as memory devices 410-416, might be determined (e.g., generated) 602 by experimental and/or analytical methods relative to a representative memory device. For example, a particular memory device, e.g., memory device 410, might be selected as a representative memory device, and differences between trim values of other memory devices, e.g., one or more of memory devices 412-416, and the representative memory device 410 might correspond to correction factors for those other memory devices. Consider the following example. For a representative memory device it is determined that its trim values are represented as binary 01100100, and for a different memory device it is determined that its trim values are represented as binary 01100110, such that the correction factor for the different memory device might be binary 00000010 relative to the representative memory device. In this example, if the representative memory device is recalibrated (e.g., in response to an initialization, a temperature change, a particular periodicity, etc.), and it is now determined that its new trim values are represented as binary 01100110, the trim values of the different memory device might be deemed to be 01101000 by simply adding the correction factor to the trim values of the representative memory device. Thus, correction factors, relative to the representative memory device, might be applied to sets of trim values and might take into consideration differences between characteristics of different memory devices (e.g., differences in driver circuit characteristics) without requiring further calibration operations for those memory devices. While the foregoing example looked at applying correction factors for a memory device as a whole, the concepts could be extended to applying correction factors to individual driver circuits within a single memory device by selecting a driver circuit of the memory device as being a representative driver circuit, determining trim values for that driver circuit and one or more remaining driver circuits of the memory device, and determining correction factors for the one or more remaining driver circuits relative to the representative driver circuit. Similarly, the correction factors might be applied to a single driver circuit of a memory device relative to a corresponding driver circuit of the representative memory device. It is noted that a correction factor for a memory device may comprise a set of correction factors, e.g., a correction factor to each driver circuit of the memory device. Similarly, although the previous example discussed a simple additive correction factor for a memory device, the correction factor could have a set of values. For example, the relative differences between a representative memory device and another memory device might be described by a polynomial equation, and the correction factor for the other memory device might include values for each of the coefficients of the polynomial equation. The correction factors could be determined during testing of the memory devices or during operation of the memory devices, such as by an external or internal controller.

A calibration operation, such as discussed above with respect to FIG. 5 might be performed 604 to determine trim values (e.g., pull-up and pull-down trim values) for a selected driver circuit of the representative memory device. Prior to, or subsequent to, transferring 512 the determined trim values to other memory devices, each set of trim values might be adjusted 606 by a correction factor corresponding to one or more of other memory devices selected to receive a set of trim values. If the adjustment 606 of the sets of trim values is prior to transferring 512 the determined trim values, the adjusted trim values may be transferred 608 to their respective memory devices. For example, a set of trim values might have been determined (e.g., generated) during a calibration operation performed 604 on memory device 410. The trim values transferred 608 to one or more other memory devices (e.g., 412-416) might be adjusted 606 by the memory device specific corrections factors determined 602 previously. Thus, each other memory device 412-416 may receive a set of trim values specifically tailored for each respective memory device according to one or more embodiments of the present disclosure. Alternatively, if the adjustment 606 of the sets of trim values is subsequent to transferring 512 the determined values, the corresponding correction factors could be transferred to each respective memory device, and each respective memory device could perform the adjustment 606 of its set of trim values.

As discussed above, calibration operations might be performed on a driver circuit of a single memory device to determine (e.g., generate) a set of trim values. As there are a finite number of pull-up termination devices and pull-down termination devices in a driver circuit, the accuracy to which an output impedance might be realized will be a function of the tolerances of the pull-up/pull-down resistances of the driver circuit for example. Output impedance is sometimes referred to as Rtt and the accuracy of an output impedance of a driver circuit which might be realized is sometimes referred to as Rtt variability. An increase in output impedance resolution (e.g., a reduction in Rtt variability) and/or a reduction in power usage might be realized by concurrently adjusting (e.g., calibrating) an output impedance of two or more driver circuits in parallel according to various embodiments of the present disclosure. According to such an embodiment, a driver circuit (e.g., output driver circuit) from two or more memory devices might be coupled in parallel and be concurrently calibrated.

Figure 7:
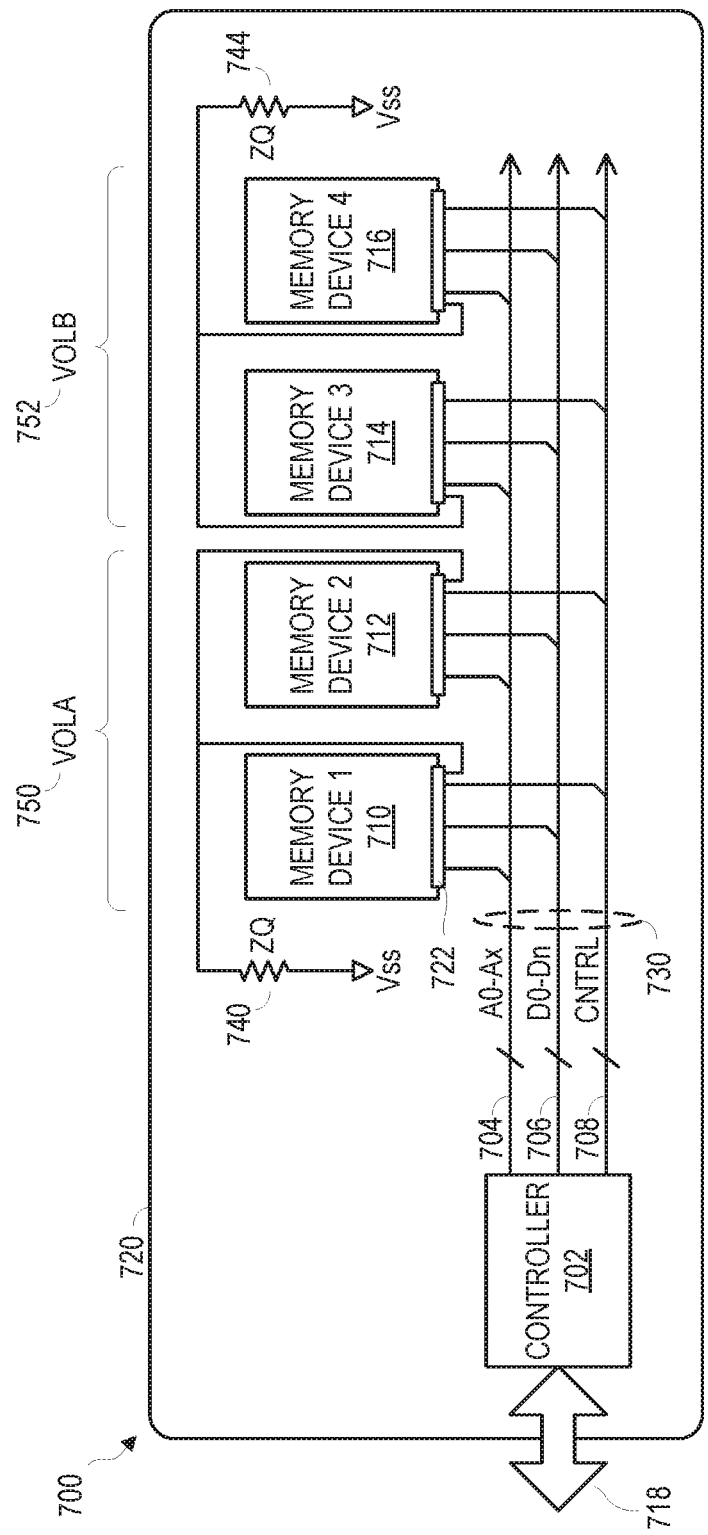
FIG. 7 illustrates a functional block diagram of an electronic system according to an embodiment of the present disclosure.

FIG. 7 illustrates a functional block diagram of a plurality of memory devices 710-716 coupled together such as to part of an electronic system 720. The memory devices of the electronic system might be arranged in a plurality of volumes, such as Volume A (VOLA) 750 and Volume B (VOLB) 752. Each volume might include a multi-chip package (MCP) and include two or more memory devices where each memory device includes a memory die, for example. Each of the memory devices of a volume might be referred to as a logical unit (LUN.) For example, VOLA 750 might include two LUNs, i.e., memory devices 710 and 712, and VOLB 752 might include two LUNs, i.e., memory devices 714 and 716. Each volume shown in FIG. 7 is coupled to a ZQ resistor. For example, the memory devices of VOLA 750 are commonly coupled to ZQ resistor 740, whereas the memory devices of VOLB 752 are commonly coupled to ZQ resistor 744. Memory operations, such as a read operation, might be selected to be performed in a particular memory device of a particular volume. For example, a read operation might be selected to be performed in Memory Device 1 710 of VOLA 750. During the read operation, the memory devices of at least one other volume, such as VOLB 752 in this example, might be selected to operate in a termination mode while the read operation is performed in VOLA 750, for example.

Figure 8:
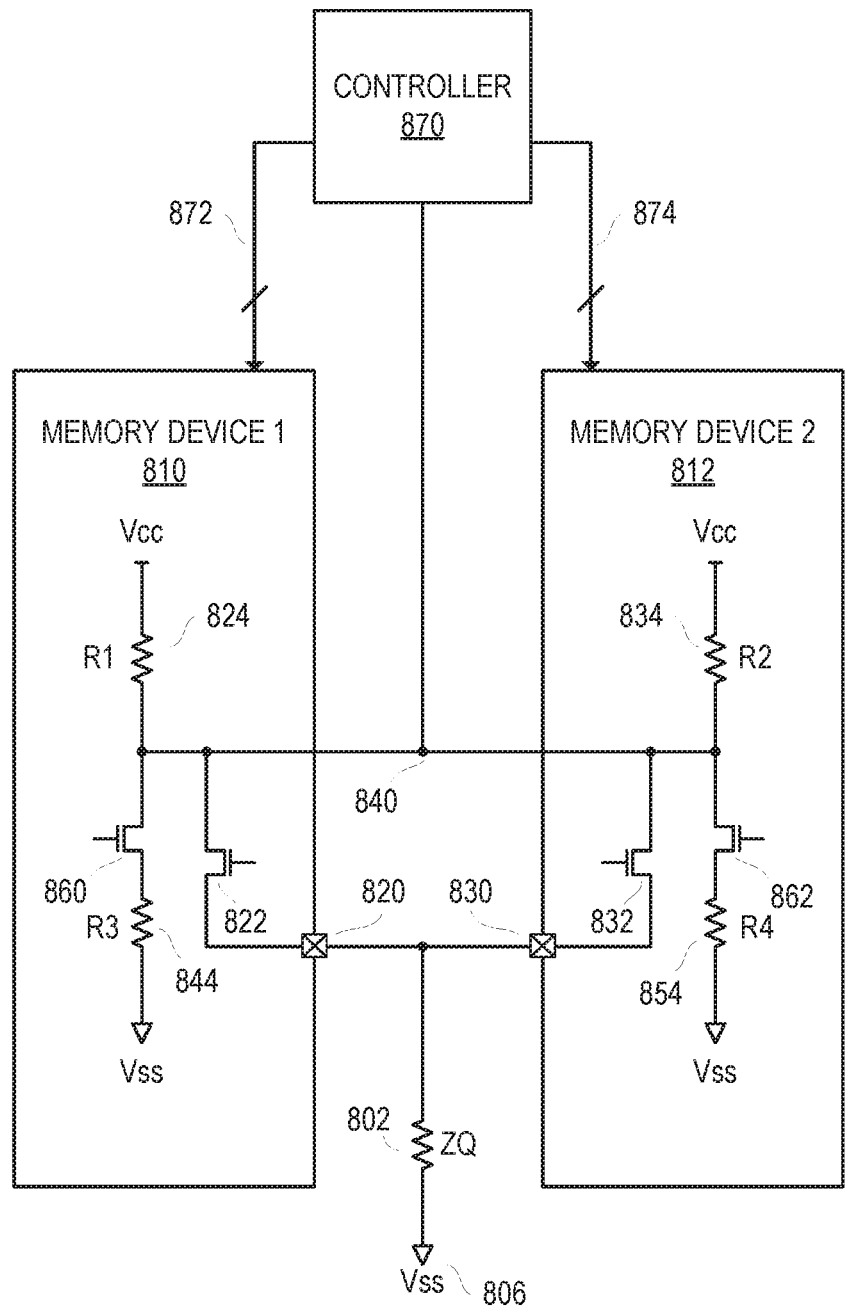
FIG. 8 illustrates a schematic representation of termination circuitry configured for performing a calibration operation according to an embodiment of the present disclosure.

A method according to various embodiments of concurrently calibrating a driver circuit from two or more memory devices might be described by reference to FIGS. 7, 8 and 9. FIG. 8 illustrates a simplified schematic of two memory devices of a volume configured in parallel to be concurrently calibrated according to one or more embodiments of the present disclosure. FIG. 8 illustrates additional detail of the configuration of two memory devices 810 and 812 and their associated ZQ resistor 802 according to various embodiments of the present disclosure. Memory Device 1 810 and Memory Device 2 812 might represent the memory devices 710 and 712 of VOLA 750 shown in FIG. 7, for example.

Resistance R1 824 is shown representative of one or more termination devices (e.g., activated pull-up termination devices) of a driver circuit of Memory Device 1 810, such as pull-up termination devices 314 shown in FIG. 3, for example. Resistance R2 834 is shown representative of one or more termination devices (e.g., activated pull-up termination devices) of a driver circuit of Memory Device 2 812, such as pull-up termination devices 314 shown in FIG. 3. Resistance R3 844 is shown representative of one or more termination devices (e.g., activated pull-down termination devices) of the driver circuit of Memory Device 1 810, such as pull-down termination devices 320 shown in FIG. 3, for example. Similarly, resistance R4 854 is shown representative of one or more termination devices (e.g., activated pull-down termination devices) of the driver circuit of Memory Device 2 812, such as pull-down termination devices 320 shown in FIG. 3. Transistors 860 and 862 are shown to illustrate that the pull-down termination devices represented by resistance R3 844 and resistance R4 854 might be decoupled from their respective output signal lines (e.g., removed from a circuit path with output node 840, such as during a particular portion of a calibration operation, for example. Decoupling may be performed by deactivating the pull-down termination devices of the driver circuit, such as by deactivating the transistors 316 of pull-down termination devices 320 of driver circuit 318.

Output nodes (e.g., output signal lines) of each driver circuit of Memory Device 1 810 and Memory Device 2 812, respectively, might be coupled together as output node 840 (e.g., a shared node) and through device interface nodes 820 and 830 (e.g., that might correspond to a device interface node 342 of FIG. 3) to be commonly coupled to the ZQ resistor 802. Thus, an output node from a driver circuit of Memory Device 1 810 and an output node from a driver circuit of Memory Device 2 812 might be coupled (e.g., concurrently coupled) to the same ZQ resistor 802 to facilitate performing a calibration operation according to one or more embodiments of the present disclosure. The ZQ resistor 802 is shown coupled to receive a reference potential 806, such as ground potential Vss, and might be selectively coupled to the output node 840 by way of transistor 822 of Memory Device 1 810 and/or transistor 832 of Memory Device 2 812 (e.g., such as transistor 346 of FIG. 3). As used herein, the impedance of a device interface node of a memory device will be deemed to represent an impedance of its corresponding output node of the memory device (i.e., an output node to which the device interface node might be coupled).

Controller 870 might be configured to generate control signals on control signal lines 872 and 874 to cause Memory Device 1 810 and Memory Device 2 812, respectively, to selectively activate and deactivate the termination devices, such as represented by resistances R1 824, R2 834, R3 844 and R4 854 of their respective driver circuits. Control signal lines 872 or 874 might be representative of the control signal bus 220 discussed above with respect to FIG. 2, for example. For example, Controller 870 (e.g., external controller) might generate control signals on control signal lines 872 and 874 to cause controllers (e.g., internal controllers) of Memory Device 1 810 and Memory Device 2 812, respectively, to perform calibration operations and operate other internal circuitry as described herein. Controllers acting in concert, such as Controller 870 and the controllers of Memory Device 1 810 and Memory Device 2 812, may be thought of as a single controller.

Figure 9:
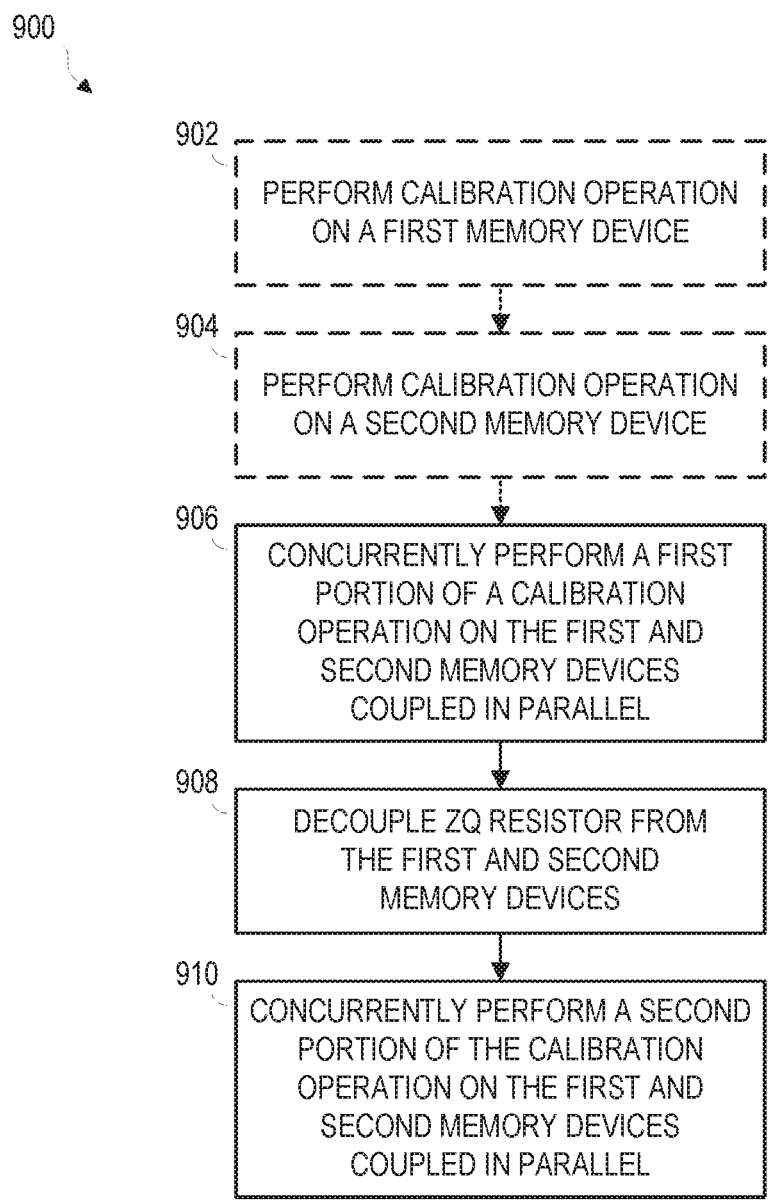
FIG. 9 illustrates a flowchart of a calibration operation according to an embodiment of the present disclosure.

FIG. 9 illustrates a flowchart corresponding to a calibration method to calibrate an output impedance of two driver circuits of two memory devices coupled together in parallel (e.g., acting as termination devices in parallel) to a desired (e.g., target) output impedance according to one or more embodiments of the present disclosure. The calibration method illustrated by FIG. 9 might be facilitated by the Controller 870 shown in FIG. 8. Two memory devices, such as Memory Device 1 810 and Memory Device 2 812, might be selected for calibration. However, various embodiments according to the present disclosure are not limited to selecting only two memory devices coupled in parallel for a calibration.

A first calibration operation 902 might be individually performed on Memory Device 1 810 to adjust an impedance of device interface node 820 near the desired (e.g., target) output impedance and to determine a set of corresponding trim values to produce that impedance, such as described with reference to steps 502-510 of FIG. 5. For example, an output signal line of Memory Device 1 810 (e.g., an output signal line coupled to data node 840) might be coupled to the ZQ resistor 802 (e.g., through its device interface node 820) by activating transistor 822 to perform a calibration (e.g., rough calibration) of the pull-up termination devices for generating resistance R1 824, including determining a set of trim values corresponding to a configuration of the pull-up termination devices represented by resistance R1 824. Transistor 832 may be deactivated during the first calibration operation 902. The ZQ resistor 802 might then be decoupled from the data node 840 by transistor 822 and transistor 860 might be activated. A calibration (e.g., rough calibration) of the pull-down termination devices for generating resistance R3 844 might then be performed including determining a set of trim values corresponding to a configuration of the pull-down termination devices represented by resistance R3 844. The termination devices represented by resistances R1 824 and R3 844 might be deactivated after completion of the first calibration operation 902 to remove the effect of those resistances from the output signal line of Memory Device 1 810, and thus from the data node 840. Similarly, the termination devices represented by resistances R2 834 and R4 854 might be deactivated throughout the first calibration operation 902 to remove the effect of those resistances from the output signal line of Memory Device 2 812, and thus from the data node 840.

The first calibration operation 902 might be further illustrated by way of a specific example. As discussed above, transistor 832 and the termination devices represented by resistances R2 834 and R4 854 may be deactivated during the first calibration operation 902 to remove the effect of Memory Device 2 812. A desired (e.g., target) output impedance might be 120 ohms and ZQ resistor 802 might have a resistance value of 240 ohms+/−1%. ZQ resistor 802 might be coupled to the data node 840 by way of transistor 822 and thus coupled to the output signal line of the driver circuit of Memory Device 1 810 and data node 840. Transistor 860 might be deactivated during a first portion of the first calibration operation 902 while transistor 822 is activated. Controller 870 might selectively adjust the number of activated pull-up termination devices represented by resistance R1 824 until a voltage sensed on the data node 840 is substantially equal to (e.g., reaches) Vcc/2 which is indicative that the pull-up termination resistance R1 is substantially equal to the resistance of the ZQ resistor 802. Thus, the resistance value of the activated pull-up termination resistance R1 824 is substantially equal to 240 ohms and a set of trim values corresponding to the configuration of the pull-up termination devices represented by resistance R1 824 (e.g., a set of trim values indicating which pull-up termination devices are to be activated, and which are to be deactivated) might be determined (e.g., generated).

To complete the first calibration operation 902, the ZQ resistor 802 might be decoupled from the data node 840 by transistor 822 while maintaining activation of the pull-up termination devices represented by resistance R1 824. Controller 870 might then selectively adjust the number of activated pull-down termination devices represented by resistance R3 844 until a voltage sensed on the data node 840 is again substantially equal to (e.g., reaches) Vcc/2 which is indicative that the resistance R1 824 is substantially equal to the resistance R3 844. The resistance value of the activated pull-down termination devices represented by resistance R3 844 may be substantially equal to (e.g., equal to) 240 ohms and a set of trim values corresponding to the configuration of the pull-down termination devices might be determined (e.g., generated). Thus, an impedance of the device interface node 820, representative of the output signal line of the driver circuit of Memory Device 1 810, substantially equal to (e.g., equal to) the desired (e.g., target) output impedance might be generated by configuring the pull-up termination devices represented by resistance R1 824 and pull-down termination devices represented by resistance R3 844 using the set of trim values determined during the first calibration operation 902.

A second calibration operation 904 similar to the first calibration operation 902 might be performed on another memory device, e.g., Memory Device 2 812 (with transistor 822, and termination devices represented by resistances R1 824 and R3 844, deactivated), to adjust an impedance of the device interface node 830 near the desired (e.g., target) impedance and to determine (e.g., generate) a set of corresponding trim values for termination devices represented by resistance R2 834 and resistance R4 854, such as described with reference to steps 502-510 of FIG. 5. Thus, the first calibration operation 902 and the second calibration operation 904 might be performed independently on Memory Device 1 and Memory Device 2, respectively, so as to determine (e.g., generate) a set of trim values for each memory device which enable configuring the driver circuits of each memory device to exhibit an impedance substantially near the desired (e.g., target) impedance. It is noted that for embodiments having more than two memory devices sharing a same data node 840 and ZQ resistor 802, additional independent calibration operations could be performed on the additional memory devices, where memory devices other than the memory device currently being calibrated have their termination devices deactivated to remove the effect of their resistances from the current calibration operation.

A first portion of a concurrent calibration operation 906 might be performed on Memory Device 1 810 and Memory Device 2 812 according to various embodiments of the present disclosure. This first portion of the concurrent calibration operation 906 might be performed subsequent to performing the first calibration operation 902 and the second calibration operation 904, or it might be performed without performing the first calibration operation 902 and the second calibration operation 904. Referring again to FIG. 8, both transistors 822 and 832 are activated so as to couple the ZQ resistor 802 to data node 840. Thus, the pull-up termination devices represented by resistance R1 824 and resistance R2 834 are in parallel with each other and in series with the ZQ resistor 802. It is noted that for embodiments having more than two memory devices sharing a same data node 840 and ZQ resistor 802, the additional memory devices could be similarly configured to concurrently couple their respective resistances to the ZQ resistor 802.

As the termination devices including resistance R1 and resistance R2 are coupled in parallel a lesser number of individual termination devices of each are needed to attempt to match the resistance of the ZQ resistor. For example, resistance R1 824 and resistance R2 834 were both calibrated to be substantially equal to 240 ohms during the first calibration operation 902 and the second calibration operation 904, respectively. As resistance R1 824 and resistance R2 834 are now in parallel, their combined resistance, based on the foregoing example, would be substantially equal to 120 ohms. Reducing the number of activated pull-up termination devices generating resistance R1 and resistance R2 by one half might result in a resistance of each of resistances R1 and R2 to be substantially equal to 480 ohms. Thus, by deactivating half of the termination devices generating each of resistance R1 and resistance R2, the resulting parallel resistance of resistance R1 and resistance R2 would be substantially equal to 240 ohms. As discussed above, more than two memory devices might be calibrated in parallel according to various embodiments of the present disclosure. Thus, when coupled in parallel, a number of activated termination devices of each driver circuit from a foregoing independent calibration operation (e.g., calibration operation 902 or 904) might be divided by the number of memory devices coupled in parallel to achieve a resulting parallel resistance expected to equal the pull-up resistance of a driver circuit calibrated independently, for example. This number of activated termination devices for each driver circuit of a number of memory devices coupled in parallel (i.e., the number of activated termination devices from a previous independent calibration operation divided by the number of memory devices coupled in parallel) might be used as a starting point for the portions (e.g., 906 and 910) of a concurrent calibration operation. The divided number might be selected as a closest integer value (e.g., a rounded value), a next higher integer value, or a next lower integer value (e.g., a truncated value) of the number of activated termination devices from a previous independent calibration operation divided by the number of memory devices coupled in parallel.

During the first portion of the concurrent calibration operation 906, a voltage of the data node 840 may be sensed while Controller 870 selectively activates and/or deactivates termination devices generating both resistance R1 824 and resistance R2 834 in an order or increasing or decreasing resistance values until the voltage of the data node 840 reaches (e.g., equals or exceeds, or equals or falls below) a particular (e.g., desired [e.g., target]) voltage, such as Vcc/2, for example. Controller 870 might alternate adjusting the activation and/or deactivation of termination devices represented by resistance R1 824 and resistance R2 834 so as to attempt to equalize any cumulative differences between resistance R1 824 and resistance R2 834. For example, when an order of decreasing resistance includes successively activating additional numbers of termination devices, Controller 870 may activate one additional termination device in a first one of the memory devices, one additional termination device in a next one of the memory devices, and so on through each of the memory devices coupled in parallel, and repeating this cycle if further termination devices are desired. A sensing of the data node 840 could be performed between each activation of termination devices. When a voltage of the data node 840 is sensed at a level indicative that the parallel pull-up resistance of resistance R1 824 and resistance R2 834 has reached (e.g., exceeded or fallen below) the ZQ resistor 802 resistance, such as a voltage of Vcc/2, a set of trim values corresponding to the activated pull-up termination devices represented by resistance R1 and the activated pull-up termination devices represented by resistance R2 might be determined (e.g., generated).

The ZQ resistor 802 might be decoupled 908 from the data node 840 following the determination of the set of trim values corresponding to the generation of resistance R1 824 and resistance R2 834, such as be deactivating transistors 822 and 832, for example. A second portion of the calibration operation 910 might then be performed on the pull-down termination devices, such as represented by resistance R3 844 and resistance R4 854, in a manner such as previously described. For example, a voltage of the data node 840 may be sensed while Controller 870 selectively activates and/or deactivates termination devices generating both resistance R3 844 and resistance R4 854 in an order or increasing or decreasing resistance values until the voltage of the data node 840 reaches (e.g., equals or exceeds, or equals or falls below) a particular (e.g., desired [e.g., target]) voltage, such as Vcc/2, for example. Controller 870 might alternate adjusting the activation and/or deactivation of termination devices represented by resistance R3 844 and resistance R4 854 so as to attempt to equalize any cumulative differences between resistance R3 844 and resistance R4 854, for example. When a voltage of the data node 840 is sensed at a level indicative that the parallel pull-down resistance of resistance R3 844 and resistance R4 854 is equal to the parallel pull-up resistance of resistance R1 824 and resistance R2 834, such as a voltage of Vcc/2, a set of trim values corresponding to the activated pull-down termination devices represented by resistance R3 844 and the activated pull-down termination devices represented by resistance R4 854 might be determined (e.g., generated).

The various embodiments discussed above with respect to FIG. 8 discussed a schematic representation of what is referred to as center tap termination configuration in each memory device. A center tap termination configuration includes both pull-up resistance R1 824 and pull-down resistance R3 844, for example. Another type of termination configuration is referred to as VDDQ termination. A typical VDDQ termination configuration includes only pull up termination devices, such as represented by resistance R1 824 shown in FIG. 8. A calibration operation according to one or more embodiments might be implemented in a memory system comprising memory device driver circuits configured for VDDQ termination.

As discussed above, VDDQ termination configured driver circuits might only incorporate pull-up termination devices. Thus, according to various embodiments, calibration operations discussed above with respect to FIGS. 7, 8 and 9 might be performed in a VDDQ termination scenario by omitting the operations involving calibration of pull-down termination devices as VDDQ termination does not include pull-down termination devices.

CONCLUSION

In summary, one or more embodiments of the present disclosure provide methods of selecting one or more memory devices to facilitate adjustment of output impedances for a plurality of memory devices of a memory system. Various embodiments according to the present disclosure may facilitate adjustment of output impedance of a plurality of memory device driver circuits coupled in parallel and calibrated concurrently, for example.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a plurality of memory devices, the method comprising:
   configuring a plurality of termination devices of a particular driver circuit of a particular memory device of the plurality of memory devices;
   storing, to the particular memory device, a first plurality of trim values representative of the configuration of the plurality of termination devices of the particular driver circuit;
   after storing the first plurality of trim values to the particular memory device, transferring a second plurality of trim values from the particular memory device to a different memory device of the plurality of memory devices external to the particular memory device; and
   configuring a plurality of termination devices of a driver circuit of the different memory device in response to the second plurality of trim values.

2. The method of claim 1, wherein transferring the second plurality of trim values comprises transferring a same plurality of trim values as the first plurality of trim values.

3. The method of claim 2, further comprising:
   transferring a correction factor to the different memory device.

4. The method of claim 3, wherein configuring the plurality of termination devices of the driver circuit of the different memory device is in response to the second plurality of trim values and the correction factor.

5. The method of claim 1, wherein transferring the second plurality of trim values comprises transferring a different plurality of trim values than the first plurality of trim values.

6. The method of claim 5, further comprising:
   applying a correction factor to the first plurality of trim values to obtain the second plurality of trim values.

7. The method of claim 6, wherein applying the correction factor to the first plurality of trim values to obtain the second plurality of trim values comprises performing a binary addition of the correction factor and the first plurality of trim values.

8. The method of claim 1, wherein configuring the plurality of termination devices of the particular driver circuit comprises configuring the particular driver circuit to match a particular impedance.

9. The method of claim 8, wherein configuring the particular driver circuit to match the particular impedance comprises configuring the particular driver circuit to match a value of a reference resistance.

10. A method of operating a memory device, comprising:
    adjusting an impedance of a particular driver circuit of a particular memory device to a desired impedance during a particular calibration of the particular driver circuit;
    determining configuration information corresponding to a configuration of the particular driver circuit adjusted to the desired impedance during the particular calibration;
    storing a first set of trim values representative of the configuration information corresponding to the configuration of the particular driver circuit adjusted to the desired impedance during the particular calibration; and
    adjusting an impedance of a different driver circuit of the particular memory device in response to the first set of trim values and a correction factor representative of expected differences in characteristics between the particular driver circuit and the different driver circuit;
    wherein the correction factor is determined prior to the particular calibration.

11. The method of claim 10, further comprising determining the correction factor using a method selected from a group consisting of an experimental method and an analytical method.

12. The method of claim 10, further comprising determining the correction factor at a time selected from a group consisting of during testing of the memory device and during operation of the memory device.

13. The method of claim 10, further comprising:
    prior to the particular calibration, adjusting the impedance of the particular driver circuit to the desired impedance during a different calibration of the particular driver circuit;
    determining configuration information corresponding to the configuration of the particular driver circuit adjusted to the desired impedance during the different calibration;
    storing a second set of trim values representative of the configuration information corresponding to the configuration of the particular driver circuit adjusted to the desired impedance during the different calibration;
    adjusting the impedance of the different driver circuit to the desired impedance;
    determining configuration information corresponding to the configuration of the different driver circuit adjusted to the desired impedance;
    storing a third set of trim values representative of the configuration information corresponding to the configuration of the different driver circuit adjusted to the desired impedance; and
    determining the correction factor in response to a difference between the second set of trim values and the third set of trim values.

14. The method of claim 10, wherein the correction factor is a first correction factor, the method further comprising:
    adjusting an impedance of an additional driver circuit of the particular memory device in response to the first set of trim values and a second correction factor representative of expected differences in characteristics between the particular driver circuit and the additional driver circuit.

15. The method of claim 14, wherein adjusting the impedance of the additional driver circuit in response to the first set of trim values and the second correction factor comprises a second correction factor different from the first correction factor.

16. A method of operating a plurality of memory devices, the method comprising:
    configuring a plurality of termination devices of a particular driver circuit of a particular memory device of the plurality of memory devices;
    storing, to the particular memory device, a first plurality of trim values representative of the configuration of the plurality of termination devices of the particular driver circuit;
    determining a second plurality of trim values in response to the first plurality of trim values and a correction factor representative of expected differences in characteristics between the particular driver circuit and a driver circuit of a different memory device of the plurality of memory devices, wherein determining the second plurality of trim values is performed by a memory device of the plurality of memory devices selected from a group consisting of the particular memory device and the different memory device;

when determining the second plurality of trim values is performed by the particular memory device:
  transferring the second plurality of trim values from the particular memory device to the different memory device of the plurality of memory devices; and
  configuring a plurality of termination devices of the driver circuit of the different memory device in response to the second plurality of trim values; and
when determining the second plurality of trim values is performed by the different memory device:
  transferring the first plurality of trim values and the correction factor from the particular memory device to the different memory device; and
  configuring the plurality of termination devices of the driver circuit of the different memory device in response to the second plurality of trim values after determining the second plurality of trim values.

17. The method of claim 16, wherein configuring the plurality of termination devices of the particular driver circuit comprises configuring a plurality of pull-up termination devices of the particular driver circuit, wherein storing the first plurality of trim values to the particular memory device comprises storing a plurality of trim values representative of the configuration of the plurality of pull-up termination devices of the particular driver circuit, and wherein configuring the plurality of termination devices of the driver circuit of the different memory device comprises configuring a plurality of pull-up termination devices of the driver circuit of the different memory device, the method further comprising:
  configuring a plurality of pull-down termination devices of the particular driver circuit;
  storing, to the particular memory device, a third plurality of trim values representative of the configuration of the plurality of pull-down termination devices of the particular driver circuit;
  determining a fourth plurality of trim values in response to the third plurality of trim values and the correction factor, wherein determining the fourth plurality of trim values is performed by the particular memory device when determining the second plurality of trim values is performed by the particular memory device, and wherein determining the fourth plurality of trim values is performed by the different memory device when determining the second plurality of trim values is performed by the different memory device;
  when determining the fourth plurality of trim values is performed by the particular memory device:
    transferring the fourth plurality of trim values from the particular memory device to the different memory device; and
    configuring a plurality of pull-down termination devices of the driver circuit of the different memory device in response to the fourth plurality of trim values; and
  when determining the fourth plurality of trim values is performed by the different memory device:
    transferring the third plurality of trim values from the particular memory device to the different memory device; and
    configuring the plurality of pull-down termination devices of the driver circuit of the different memory device in response to the fourth plurality of trim values after determining the fourth plurality of trim values.

18. The method of claim 16, further comprising:
wherein storing the first plurality of trim values to the particular memory device comprises storing a first binary number representative of the first plurality of trim values to the particular memory device;
wherein determining the correction factor comprises determining a second binary number representative of the expected differences in characteristics between the particular driver circuit and the driver circuit of the different memory device; and
wherein determining the second plurality of trim values comprises adding the first binary number and the second binary number, thereby obtaining a third binary number representative of the second plurality of trim values.

19. The method of claim 16, further comprising:
determining the correction factor in response to the expected differences in characteristics between the particular driver circuit and the driver circuit of the different memory device including at least one type of characteristic selected from a group consisting of process characteristics and operating characteristics.

20. The method of claim 16, further comprising:
describing the expected differences in characteristics between the particular driver circuit and the driver circuit of the different memory device by a polynomial equation; and
determining the correction factor as a plurality of coefficients of the polynomial equation.

* * * * *